United States Patent

Matsubara

(10) Patent No.: US 10,923,316 B2
(45) Date of Patent: Feb. 16, 2021

(54) PRIMARY BEAM SCANNING APPARATUS AND SIGNAL PROCESSING METHOD

(71) Applicant: JEOL Ltd., Tokyo (JP)

(72) Inventor: Takanori Matsubara, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 16/561,443

(22) Filed: Sep. 5, 2019

(65) Prior Publication Data

US 2020/0090902 A1 Mar. 19, 2020

(30) Foreign Application Priority Data

Sep. 19, 2018 (JP) .............................. JP2018-174946

(51) Int. Cl.
*H01J 37/26* (2006.01)
*H01J 37/28* (2006.01)

(52) U.S. Cl.
CPC ............ *H01J 37/265* (2013.01); *H01J 37/28* (2013.01); *H01J 2237/2801* (2013.01)

(58) Field of Classification Search
CPC ........ H01J 37/244; H01J 37/265; H01J 37/28; H01J 37/2801; G01N 23/04
See application file for complete search history.

(56) References Cited

U.S. PATENT DOCUMENTS

| | | | | |
|---|---|---|---|---|
| 2005/0286782 A1* | 12/2005 | Burlingame | ............. | G06K 9/36 382/233 |
| 2009/0026369 A1* | 1/2009 | Miyai | .................. | G01N 23/225 250/310 |
| 2009/0208092 A1* | 8/2009 | Ominami | ............. | H01J 37/244 382/149 |

FOREIGN PATENT DOCUMENTS

| | | |
|---|---|---|
| JP | H0555919 A | 3/1993 |
| JP | 2003151482 A | 5/2003 |
| JP | 2009032445 A | 2/2009 |
| JP | 2010164442 A | 7/2010 |

OTHER PUBLICATIONS

"Improving ADC Resolution by Oversampling and Averaging", Silicon Laboratories, 2013, https://www.silabs.com/SupportDocuments/TechnicalDocs/an118.pdf (Year: 2013).*
Extended European Search Report issued in EP19195432.0 dated Feb. 4, 2020.
Improving ADC Resolution by Oversampling and Averaging; Silicon Laboratories; 2013; retrieved from the Internet: https://www.silabs.com/SupportDocuments/TechnicalDocs/an118.pdf.
Japanese Office Action issued in JP2018-174946 dated Nov. 24, 2020.

* cited by examiner

*Primary Examiner* — David E Smith
(74) *Attorney, Agent, or Firm* — The Webb Law Firm

(57) ABSTRACT

There is provided a primary beam scanning apparatus capable of producing data having a bit depth higher than the resolution of an analog-to-digital converter. The primary beam scanning apparatus is capable of controlling a scan rate of a primary beam for scanning a specimen. The scanning apparatus includes a detector for detecting signals generated in response to irradiation of the specimen with the primary beam and providing an analog output signal, an analog-to-digital converter for sampling the analog signal and converting it into a digital signal, and an arithmetic section for averaging the digital signal.

6 Claims, 5 Drawing Sheets

PRIMARY BEAM SCANNING APPARATUS AND SIGNAL PROCESSING METHOD

CROSS-REFERENCE TO RELATED APPLICATION

This application claims priority to Japanese Patent Application No. 2018-174946 filed Sep. 19, 2018, the disclosure of which is hereby incorporated by reference in its entirety.

BACKGROUND OF THE INVENTION

Field of the Invention

The present invention relates to a primary beam scanning apparatus and signal processing method.

Description of Related Art

There are known primary beam scanning apparatuses which allow for analysis and observation of a specimen by detecting secondary emissions (such as electrons and characteristic X-rays) emanating from the specimen in response to scanning of a primary beam such as an electron beam, an ion beam, or X-rays over the specimen. Examples of such primary beam scanning apparatus include scanning transmission electron microscope (STEM), electron probe microanalyzer (EPMA), Auger microprobe, and X-ray photoelectron spectrometer (XPS) (see, for example, JP-A-2010-164442).

For example, with a scanning electron microscope (SEM), secondary electrons emitted from a specimen by irradiating it with an electron beam are detected by a secondary electron detector and converted into an electrical signal. In the SEM, the analog electrical signal is converted into a digital form and subject to image processing to generate a secondary electron image (SEM image). The electrical signal obtained at each analysis point on the specimen is converted into one pixel of image data of the SEM image by image processing. The bit depth of the image data maximizes the resolution of the A/D converter. However, the bit depth may decrease according to processing performed subsequently. That is, the performance of the A/D converter directly affects the bit depth per pixel of the final SEM image.

Where an observation or analysis is performed with a primary beam scanning apparatus as described above, the required amount of data varies according to the purpose of the observation or analysis. However, the bit depth of data depends on the performance of the used A/D converter and is fixed. Therefore, in order to obtain data of a higher bit depth, an A/D converter with a higher resolution is needed.

SUMMARY OF THE INVENTION

One aspect of the primary beam scanning apparatus associated with the present invention is capable of controlling a scan rate of a primary beam for scanning a specimen. The primary beam scanning apparatus comprises: a detector for detecting signals generated in response to irradiation of the specimen with the primary beam and providing an analog output signal; an analog-to-digital converter for sampling the analog signal and converting it into a digital signal; and an arithmetic section for averaging the digital signal.

In this primary beam scanning apparatus, the analog signal is sampled and converted into a digital signal by the A/D converter. The obtained digital signal is averaged. This permits the bit depth of the digital signal to be modified according to the scan rate at which the primary beam is scanned. Consequently, this primary beam scanning apparatus can provide data having a bit depth higher than the resolution of the A/D converter.

One aspect of the signal processing method associated with the present invention is for use in a primary beam scanning apparatus capable of controlling a scan rate of a primary beam for scanning a specimen. This method involves irradiating the specimen with the primary beam to induce signals, detecting the induced signals by a detector that provides an analog output signal, sampling the analog output signal from the detector and converting it into a digital signal by an analog-to-digital converter, and averaging the digital signal.

In this signal processing method, the analog signal is sampled and converted into a digital signal by the analog-to-digital converter, and the resulting digital signal is averaged. Therefore, the bit depth of the digital signal can be modified according to the scan rate of the primary beam. Consequently, in this signal processing method, data having a bit depth higher than the resolution of the analog-to-digital converter can be obtained.

DESCRIPTION OF THE INVENTION

Preferred embodiments of the present invention are hereinafter described in detail with reference to the drawings. It is to be understood that embodiments set forth below are not intended to unduly restrict the contents of the present disclosure described in the claims and that not all the configurations described below are the constituent components of the present invention.

Furthermore, in the embodiments given below, electron microscopes in which a specimen is scanned with an electron beam are taken as examples of the primary beam scanning apparatus associated with the present invention.

1. First Embodiment

1.1. Electron Microscope

Figure 1:
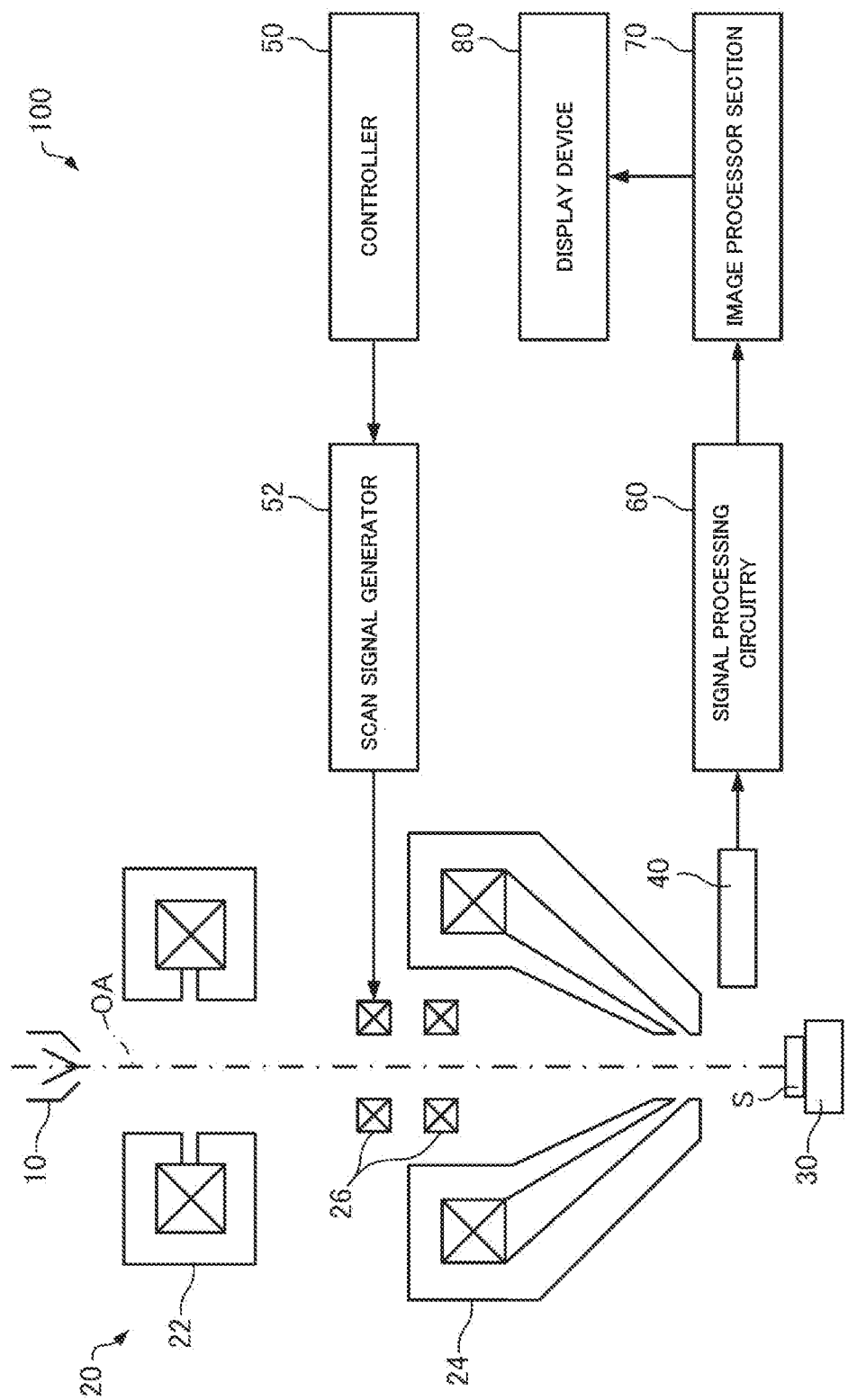
FIG. 1 is a block diagram of an electron microscope associated with a first embodiment of the present invention.

An electron microscope associated with a first embodiment is first described by referring to some of the drawings. FIG. 1 shows the configuration of the electron microscope, 100, associated with the first embodiment. The electron microscope 100 is a scanning electron microscope (SEM).

As shown in FIG. 1, the electron microscope 100 includes an electron source 10, an electron optical system 20, a specimen stage 30, a detector 40, a controller 50, a scan signal generator 52, signal processing circuitry 60, an image processor section 70, and a display device 80.

The electron source 10 produces electrons. For example, the electron source 10 is an electron gun that emits an electron beam by producing electrons from a cathode and accelerating the electrons by an anode.

The electron optical system 20 causes the electron beam emitted from the electron source 10 to be directed at a specimen S. The electron optical system 20 includes condenser lenses 22, an objective lens 24, and deflectors 26.

The electron beam emitted from the electron source 10 is converged by the condenser lenses 22. The diameter and dose of the electron beam can be controlled by the condenser lenses 22.

The objective lens 24 is disposed immediately ahead of the specimen S. The objective lens 24 focuses the electron beam into an electron probe. The objective lens 24 is fabricated including coils and a yoke, for example. In the objective lens 24, the lines of magnetic force produced by the coils are confined in the yoke that is made of a material of high magnetic permeability such as iron. The lines of magnetic force distributed at high density are allowed to leak onto the optical axis OA through a cutout (lens gap) formed in a part of the yoke.

The deflectors 26 deflect the electron beam in two dimensions. The deflectors 26 can scan the electron beam over the specimen S by being supplied with scan signals generated by the scan signal generator 52.

The specimen S is placed on the specimen stage 30. The specimen stage 30 can physically support the specimen S. The specimen stage 30 can be configured including a moving mechanism for moving the specimen S. The beam position on the specimen S can be modified by moving the specimen S with the specimen stage 30.

For example, the detector 40 is a secondary electron detector for detecting secondary electrons released from the specimen S. The detector 40 produces an output signal, for example, according to the amount of the detected secondary electrons. Alternatively, the detector 40 may be a backscattered electron detector for detecting backscattered electrons released from the specimen S.

The electron microscope 100 may further include an energy dispersive X-ray spectrometer (EDS) for detecting characteristic X-rays released from the specimen S and a wavelength dispersive X-ray spectrometer (WDS) for spectrally dispersing the characteristic X-rays with a spectrally dispersive element and detecting the dispersed characteristic X-rays.

The controller 50 controls the various components of the electron microscope 100. The controller 50 controls the size of the region (i.e., the magnification of the SEM image) scanned by the electron beam, for example, via the scan signal generator 52 and the scan rate of the electron beam. In the electron microscope 100, the scan rate of the electron beam is variable.

The controller 50 includes a processor (such as a CPU (central processing unit)) and storage devices (such as a RAM (random access memory) and a ROM (read-only memory)). Programs and data for performing various control operations are stored in the storage devices. The functions of the controller 50 can be implemented by executing programs with the processor.

The scan signal generator 52 generates scan signals based on control signals from the controller 50. The scan signals are sent to the deflectors 26. The signal processing circuitry 60 performs processing to generate image data based on the output signal from the detector 40.

The image processor section 70 performs processing to generate an SEM image based on the image data and to display the SEM image on the display device 80. The image processor section 70 includes a processor (such as a CPU) and storage devices (such as a RAM and a ROM). Programs and data for performing various control operations are stored in the storage devices. The functions of the image processor section 70 can be implemented by executing programs with the processor.

The display device 80 outputs the image created by the image processor section 70. For example, the display device 80 is a liquid crystal display (LCD) or other type of display.

Figure 2:
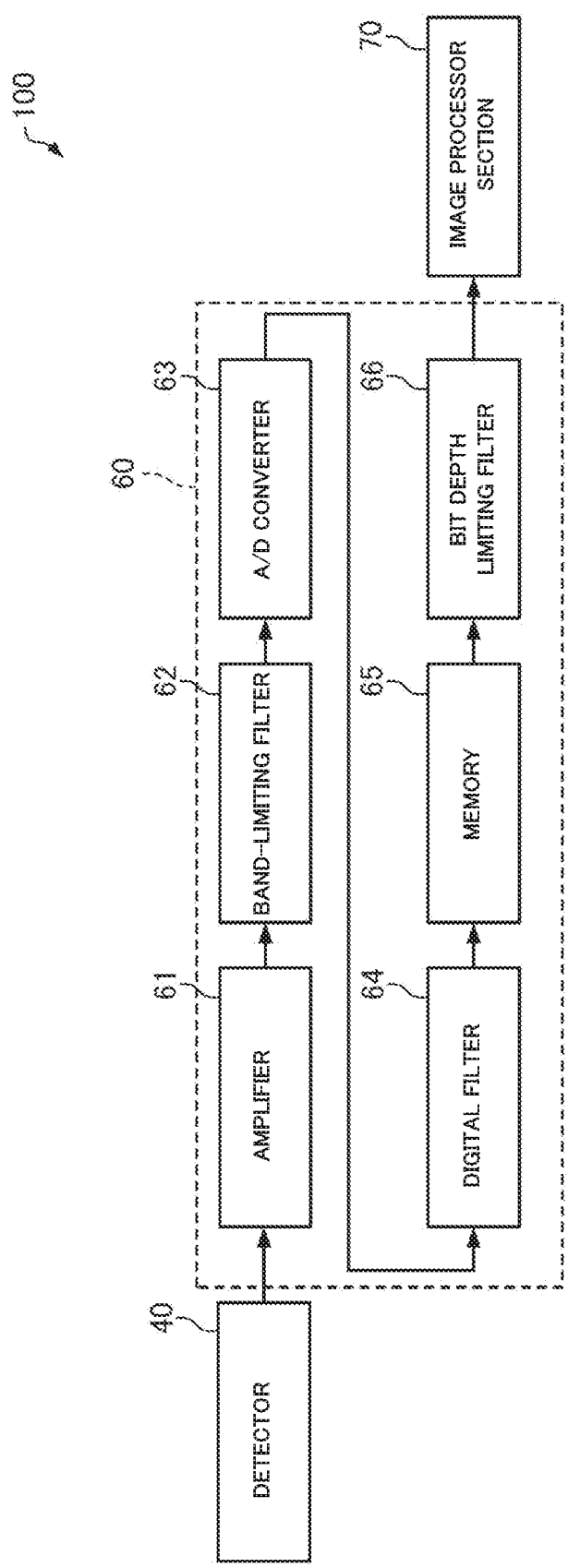
FIG. 2 is a block diagram of the signal processing circuitry of the electron microscope shown in FIG. 1.

FIG. 2 shows the configuration of the signal processing circuitry 60. As shown in FIG. 2, the signal processing circuitry 60 includes an amplifier 61, a band-limiting filter 62, an analog-to-digital converter (A/D converter) 63, a digital filter 64 (that is one example of an arithmetic section), a memory 65, and a bit depth limiting portion 66.

The amplifier 61 amplifies the analog output signal from the detector 40. The amplified analog signal from the amplifier 61 is fed to the band-limiting filter 62.

The band-limiting filter 62 limits the bandwidth of the amplified analog signal to less than a given bandwidth. The band-limited analog signal from the band-limiting filter 62 is sent to the A/D converter 63.

The A/D converter 63 samples the analog signal at a given sampling rate and converts the signal into a digital signal, which in turn is sent to the digital filter 64.

The digital filter 64 averages the digital signal and generates image data. Averaging of a time sequential digital signal is accomplished by finding the average value of each given successive interval sequentially. That is, the averaging is done by the moving-average method. The image data generated by the digital filter 64 is sent to the memory 65.

The memory 65 stores the incoming image data. In this way, image data is accumulated in the memory 65 concomitantly with continued operation of the instrument.

The bit depth limiting portion 66 limits the bit depth of the image data, for example, to a preset limit value, and transfers the limited image data to the image processor section 70.

1.2. Operation

The operation of the electron microscope 100 is next described. In the electron microscope 100, the electron beam released from the electron source 10 is scanned over the specimen S by focusing the beam with the condenser lenses 22 and objective lens 24 and deflecting the focused beam in two dimensions by the deflectors 26. Secondary electrons emitted from each analysis point on the specimen S hit by the electron beam are detected by the detector 40.

The analog electrical signal from the detector 40 is converted into image data by the signal processing circuitry 60. In the signal processing circuitry 60, the electrical signal representing each analysis point on the specimen S is converted into one pixel of image data of an SEM image. The image processor section 70 generates the SEM image based on the image data and displays the SEM image on the display device 80.

The signal processing circuitry 60 can modify the bit depth of the image data according to the scan rate of the electron beam.

In the electron microscope 100, when the electron beam is scanned, for example, at its highest scan rate, it is assumed that the A/D converter 63 samples the electrical output signal from the detector 40 once, the electrical signal being produced in response to the electron beam dwelling on a region corresponding to one pixel of the SEM image. That is, when the electron beam is scanned at the highest scan rate, the A/D converter 63 takes one sample of the electrical signal produced in response to the electron beam dwelling on a region corresponding to one pixel.

The A/D converter 63 samples the electrical signal at a constant sampling rate. That is, the sampling rate of the electrical signal at the A/D converter 63 remains constant at all times irrespective of the scan rate.

When the scan rate of the electron beam is reduced to half of the highest scan rate, the time in which the electron beam dwells on a region corresponding to one pixel is doubled. Therefore, the A/D converter 63 needs to sample the electrical signal twice, the signal being obtained by the electron beam dwelling on the region corresponding to one pixel.

Similarly, when the scan rate of the electron beam is reduced to one quarter of the highest scan rate, the time in which the electron beam dwells on the region corresponding to one pixel is increased four times. Therefore, the A/D converter 63 can take four samples of the electrical signal obtained by the electron signal dwelling on the region corresponding to one pixel.

That is, when the scan rate of the electron beam is reduced to a factor of $2^{-N}$ (where N is an integer) of the highest scan rate, the time in which the electron beam dwells on the region corresponding to one pixel is increased by a factor of $2^N$. Therefore, the A/D converter 63 can sample the electrical signal $2^N$ times, the signal being obtained by the electron beam dwelling on the region corresponding to one pixel.

The digital signal from the A/D converter 63 that samples the data is averaged by the digital filter 64 at a later stage and thus smoothed. In addition, the resolution of data is improved owing to oversampling. For example, if there are two samples to be averaged, then the resolution is improved by ½ bit. If there are four samples to be averaged, then the resolution is improved by 1 bit. That is, if the number of samples to be averaged is doubled, the resolution is improved by ½ bit.

Therefore, the signal processing circuitry 60 can modify the bit depth of image data according to the scan rate of the electron beam. For this reason, if the scan rate of the electron beam is lowered, for example, the bit depth of image data can be increased. This permits the signal processing circuitry 60 to produce image data having a bit depth higher than the resolution of the A/D converter 63.

The bit depth limiting portion 66 is next described. The bit depth limiting portion 66 limits the bit depth of the image data obtained by the digital filter 64 and outputs the data.

It is assumed herein, as an example, that the present purpose is to display an SEM image of the specimen S on the display device 80 to permit observation of the image. If the display device 80 is assumed to display images of up to 8 bits per pixel, it is wasteful to set the bit depth of image data to greater than 8 bits. Furthermore, if the bit depth of image data increases, the amount of data of the image data becomes exorbitant, thus necessitating a wide band interface. In addition, the traffic through the image processor section 70 may increase, thus deteriorating the throughput.

Accordingly, if the bit depth of image data derived from the digital filter 64 is greater than 8 bits, the bit depth limiting portion 66 varies the bit depth of the image data to 8 bits and transfers the image data to the image processor section 70. If the bit depth of image data derived from the digital filter 64 is equal to or below 8 bits, the bit depth limiting portion 66 transfers the image data to the image processor section 70 without varying the bit depth. In this way, the bit depth limiting portion 66 limits the bit depth of image data to 8 bits.

There has been herein described the bit depth limiting portion 66 that limits the bit depth of image data to 8 bits. The bit depth limiting portion 66 can limit image data to any arbitrary preset limit value.

1.3. Features

The electron microscope 100 has the following features. The electron microscope 100 is capable of controlling the scan rate of the electron beam for scanning the specimen S. The microscope includes the detector 40 for detecting secondary electrons (signals) emanating from the specimen S in response to the electron beam irradiation and producing an analog output signal, the A/D converter 63 for sampling the analog signal and converting it into a digital signal, and the digital filter 64 for averaging the digital signal and generating image data.

Therefore, the electron microscope 100 can vary the bit depth of the image data according to the scan rate of the electron beam. Thus, the electron microscope 100 can produce image data having a bit depth higher than the resolution of the A/D converter 63. Consequently, with the electron microscope 100, the bit depth of image data can be easily increased, for example, without installing a high-resolution A/D converter therein.

The electron microscope 100 includes the bit depth limiting portion 66 that limits the bit depth of image data generated by the digital filter 64. Therefore, in the electron microscope 100, amounts of data more than needed can be prevented from being transferred to the image processor section 70; otherwise traffic would be increased.

2. Second Embodiment 2.1. Electron Microscope

Figure 3:
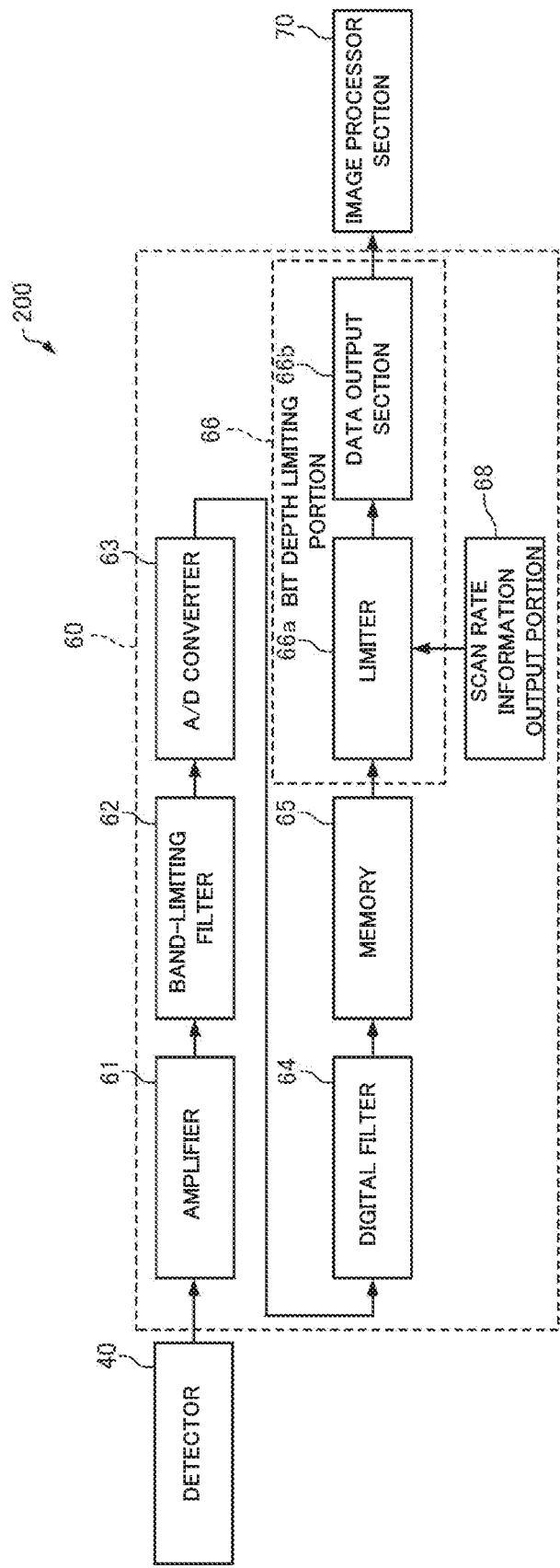
FIG. 3 is a block diagram of the signal processing circuitry of an electron microscope associated with a second embodiment.

An electron microscope associated with a second embodiment is next described by referring to some figures. FIG. 3 shows the configuration of the signal processing circuitry 60 of the electron microscope, 200, associated with the second embodiment. The electron microscope 200 is similar in configuration to the electron microscope 100 shown in FIG. 1 except for the signal processing circuitry 60 and so a description and illustration thereof is omitted.

In the following description of the electron microscope 200 associated with the second embodiment, those members which are similar in function to their counterparts of the electron microscope 100 associated with the first embodiment are indicated by the same reference numerals as in the foregoing description and a detailed description thereof is omitted.

In the above-described electron microscope 100, the bit depth limiting portion 66 limits the bit depth of image data to a preset limit value. On the other hand, in the electron microscope 200, the bit depth limiting portion 66 limits the bit depth of image data according to the scan rate of the electron beam.

In the electron microscope 200, the scan rate of the electron beam can be selected from four levels of speeds: quick scan QS1, quick scan QS2, slow scan SS1, and slow scan SS2. By performing GUI (graphical user interface)-based operations or manipulations on the electron microscope 200, for example, a desired scan rate can be selected from the four levels of scanning speeds (QS1, QS2, SS1, and SS2). Among these scan rates, the quick scan QS1 is highest. The quick scan QS2 is second highest, the slow scan SS1 is third highest, and the slow scan SS2 is lowest.

For example, if the user issues an instruction to select the quick scan QS1, the controller 50 generates a control signal to scan the electron beam at a scan rate corresponding to the quick scan QS1. Based on this control signal, the scan signal generator 52 generates a scan signal and supplies it to the deflectors 26. As a result, the electron beam is scanned at a scan rate corresponding to the quick scan QS1.

In the electron microscope 200, the signal processing circuitry 60 includes a scan rate information output portion 68 that outputs information about the scan rate of the electron beam. For example, the scan rate information output portion 68 acquires information about the current scan rate from the controller 50 and outputs information about the current scan rate. The information about the scan rate is sent to a limiter 66a.

Figure 4:
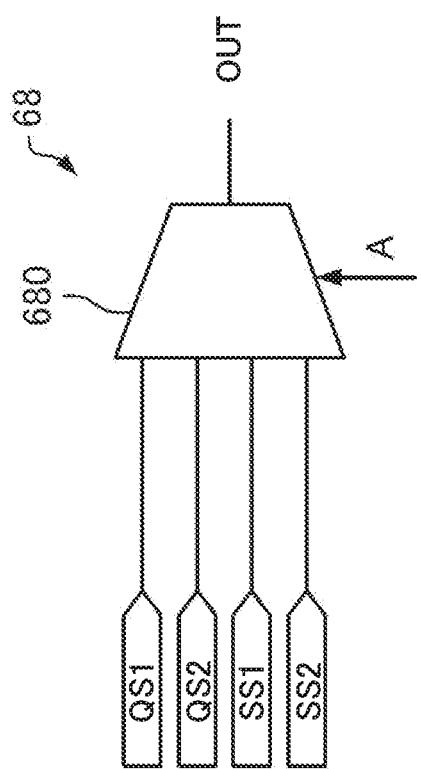
FIG. 4 is a diagram showing one example of the configuration of a scan rate information output portion.

FIG. 4 shows one example of the configuration of the scan rate information output portion 68. The scan rate information output portion 68 is configured including a selector (multiplexer) 680 for selecting one out of the four scan rates (QS1, QS2, SS1, and SS2) in response to the control signal A from the controller 50, for example, as shown in FIG. 4.

As shown in FIG. 3, the bit depth limiting portion 66 includes the aforementioned limiter 66a and a data output section 66b. The limiter 66a limits the bit depth of image data according to the scan rate. For example, the limiter 66a accepts scan rate information from the scan rate information output portion 68, sets a limit value according to the scan rate, and limits the bit depth of the image data to the set limit value.

Where the bit depth of the image data obtained by the digital filter 64 is greater than the limit value, the limiter 66a varies the bit depth of the image data to the limit value. Where the bit depth of the image data obtained by the digital filter 64 is equal to or less than the limit value, the limiter 66a passes the image data without varying its bit depth.

The data output section 66b accepts the image data from the limiter 66a and transfers the data to the image processor section 70.

2.2. Operation

The operation of the electron microscope 200 is next described. In the following, only differences with the operation of the above-described electron microscope 100 are described; a description of similarities is omitted.

Where the scan rate of the electron beam is set to the quick scan QS1, for example, the limiter 66a sets the limit value to $L_{QS1}$, thus limiting the bit depth of image data to the limit value $L_{QS1}$. The image data whose bit depth is limited is output from the data output section 66b.

The limit value $L_{QS1}$ is smaller than limit value $L_{QS2}$ used when the scan rate is the quick scan QS2 (i.e., $L_{QS1} < L_{QS2}$). Therefore, by limiting the bit depth of image data to the limit value $L_{QS1}$, the transfer load on the image processor section 70 can be reduced.

Similarly, where the scan rate of the electron beam is set to the quick scan QS2, the limiter 66a sets the limit value to $L_{QS2}$, so that the bit depth of image data is limited to the limit value $L_{QS2}$.

Where the scan rate of the electron beam is set to the slow scan SS2, for example, the bit depth of image data in the digital filter 64 becomes higher than the resolution of the A/D converter 63. At this time, the image data is passed through the filter while setting no limit value by the limiter 66a. That is, the image data is output from the data output section 66b while the bit depth set by the digital filter 64 is maintained unchanged. As a result, image data having a bit depth higher than the resolution of the A/D converter 63 is transferred to the image processor section 70.

Where the scan rate of the electron beam is set to the slow scan SS1, the image data may be passed through the filter without limiting the bit depth by the limiter 66a in the same way as in the case where the scan rate is set to the slow scan SS2. Where the scan rate of the electron beam is set to the slow scan SS1, the bit depth of image data may be limited to limit value $L_{SS1}$ ($L_{QS2} < L_{SS1}$) by the limiter 66a in the same way as in the case where the scan rate is set to the quick scan QS1.

In this way, in the electron microscope 200, the bit depth of image data can be limited according to the scan rate of the electron beam. Accordingly, in the electron microscope 200, optimum image data can be easily obtained according to purpose.

In the electron microscope 200, for example, if the electron optical system 20 is adjusted or a field of view of interest or an analysis position of interest is searched for, for example, the quick scan QS1 can be used as a scan rate. Where the scan rate is the quick scan QS1, the bit depth of image data is set to a small limit value by the limiter 66a and so the transfer load on the image processor section 70 can be reduced. Therefore, an SEM image can be displayed on the display device 80 in real time. The user can adjust the electron optical system 20 or search for a desired field of view without stress.

Where the specimen S is photographed or analyzed with the electron microscope 200, for example, the slow scan SS2 can be used as a scan rate. Where the scan rate is the slow scan SS2, the bit depth of image data is not limited by the limiter 66a and, therefore, image data having a bit depth higher than the resolution of the A/D converter 63 is transferred to the image processor section 70. Hence, accurate image data can be derived.

The electron microscope 200 may have an operational mode in which the limit value of the bit depth is automatically modified according to the scan rate as described above and an operational mode in which the bit depth is limited to a preset limit value as in the electron microscope 100. The electron microscope 200 may permit a user to switch at will between these two operational modes.

2.3. Modified Embodiment

In the foregoing description for example, the bit depth of image data is limited according to the scan rate of the electron beam. The bit depth of image data may not need to be limited by the limiter 66a. That is, the limiter 66a may transfer image data to the image processor section 70 while retaining the bit depth obtained by the digital filter 64 without limiting the bit depth of the image data at all times. For example, where a real-time analysis is performed during observation, image data having a maximum bit depth obtained at the scan rate available is transferred preferably without limiting the bit depth by the limiter 66a.

3. Third Embodiment

Figure 5:
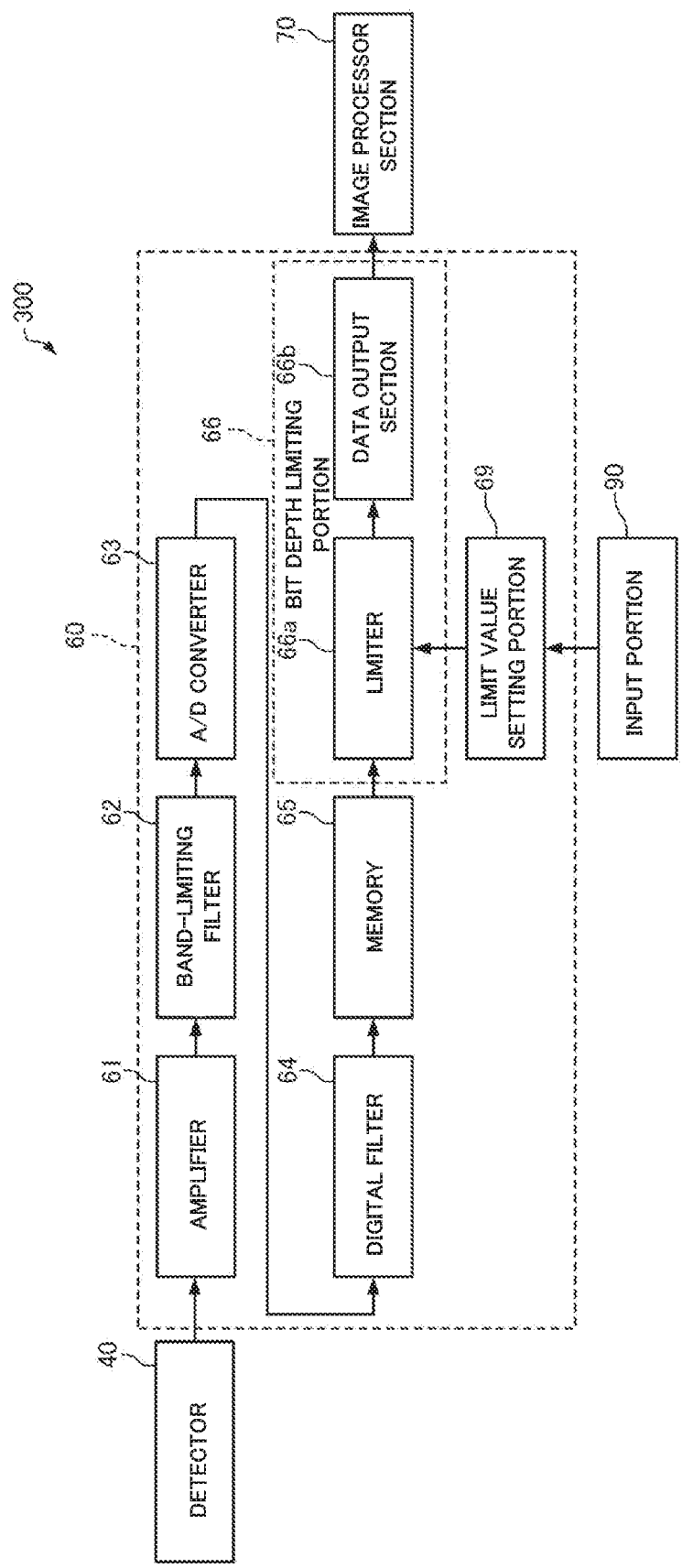
FIG. 5 is a block diagram of the signal processing circuitry of an electron microscope associated with a third embodiment.

An electron microscope associated with a third embodiment is next described by referring to some figures. FIG. 5 shows the configuration of the signal processing circuitry 60 of the electron microscope, 300, associated with the third embodiment. Since the electron microscope 300 is identical in configuration to the electron microscope 100 shown in FIG. 1 except for the signal processing circuitry 60, a description and illustration thereof is omitted.

Those members of the electron microscope 300 associated with the third embodiment which are similar in function with their counterparts of the electron microscope 100 associated with the first embodiment and the electron microscope 200 associated with the second embodiment are indicated by the same reference numerals as in the above description and a detailed description thereof is omitted.

As shown in FIG. 5, the electron microscope 300 includes an input portion 90 for accepting an input of a limit value of the bit depth of image data. The signal processing circuitry 60 includes a limit value setting portion 69 for setting a limit value of the bit depth of image data.

The input portion 90 performs processing to convert information about the limit value entered by the user into a signal and to send it to the limit value setting portion 69. The input portion 90 can be realized, for example, by buttons, keys, a microphone, a touch panel, or other input device. The user can specify a limit value using the input portion 90.

The limit value setting portion 69 sets a limit value for the bit depth of image data on the basis of the signal from the input portion 90. Consequently, the limiter 66a limits the bit depth of image data to a limit value specified by the user.

In the electron microscope 300, the bit depth limiting portion 66 limits the bit depth of image data to a limit value entered by the user and so the user can obtain image data having a desired bit depth. For example, where the specimen S is observed or a field of view of interest is searched for, the user specifies a small value as a limit value and can carry out a stress-free observation or search for a field of view of interest. Where the specimen S is photographed or analyzed, for example, the user can obtain accurate data by specifying a large value as a limit value or setting no limit value.

4. Others

It is to be understood that the present invention is not restricted to the foregoing embodiments but rather can be implemented in variously modified forms without departing from the gist of the present invention.

In the description of the above-described first embodiment, as shown in FIG. 1, the detector 40 is an electron detector for detecting secondary electrons or backscattered electrons emitted from the specimen S. The detector 40 may also be an X-ray detector for detecting characteristic X-rays emitted from the specimen S. Such an X-ray detector may be an energy dispersive X-ray spectrometer (EDS) or a wavelength dispersive X-ray spectrometer (WDS). Also, in the case where the detector 40 detects X-rays, the bit depth of X-ray data can be similarly modified according to the scan rate. The same principle applies to the electron microscope 200 associated with the second embodiment and to the electron microscope 300 associated with the third embodiment.

Furthermore, in the description of the above-described first embodiment, a scanning electron microscope is taken as one example of the primary beam scanning apparatus associated with the present invention as shown in FIG. 1. There are no restrictions on the primary beam scanning apparatus associated with the present invention as long as the apparatus can control the scan rate of the primary beam for scanning a specimen. Examples of the primary beam include an ion beam, X-rays, and a laser beam, as well as an electron beam. Examples of the primary beam scanning apparatus associated with the present invention include a scanning transmission electron microscope (STEM), an electron probe microanalyzer (EPMA), an Auger microprobe, and an X-ray photoelectron spectrometer (XPS). The same principle applies to the electron microscope 200 associated with the second embodiment and to the electron microscope 300 associated with the third embodiment.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

The invention claimed is:

1. A primary beam scanning apparatus configured to control a scan rate of a primary beam for scanning a specimen, the primary beam scanning apparatus comprising:
 a detector for detecting signals generated in response to irradiation of the specimen with the primary beam and providing an analog output signal;
 an analog-to-digital converter for sampling the analog output signal and converting the analog output signal into a digital signal; and
 an arithmetic section for averaging the digital signal,
 wherein the analog-to-digital converter changes a number of times N of sampling of the analog output signal obtained in a region corresponding to one pixel according to the scan rate by sampling the analog output signal at a given sampling rate,
 wherein the arithmetic section modifies a bit depth of one pixel of image data according to the scan rate by adding N digital signals obtained by N times of sampling of the analog output signal obtained in the region corresponding to one pixel and by dividing a result of the addition by the number of sampling times N,
 wherein the number of sampling times N is increased when the scan rate is reduced, and
 wherein the bit depth of the image data is increased when the scan rate is reduced.

2. A primary beam scanning apparatus as set forth in claim 1, further comprising a bit depth limiting portion for limiting the bit depth of the image data generated by the arithmetic section to generate limited data and outputting the limited data.

3. A primary beam scanning apparatus as set forth in claim 2, wherein said bit depth limiting portion limits the bit depth of the image data generated by the arithmetic section according to the scan rate.

4. A primary beam scanning apparatus as set forth in claim 2, further comprising an input portion for accepting inputting of a limit value for the bit depth of the image data generated by the arithmetic section, and wherein the bit depth limiting portion limits the bit depth of the image data generated by the arithmetic section to the limit value.

5. A primary beam scanning apparatus as set forth in claim 1, wherein the arithmetic section averages the digital signal and increases a bit depth of the digital signal.

6. A signal processing method for use in a primary beam scanning apparatus configured to control a scan rate of a primary beam for scanning a specimen, the method comprising:
 irradiating the specimen with the primary beam to induce signals;

detecting the induced signals by a detector that provides an analog output signal;

sampling the analog output signal from the detector and converting the analog output signal into a digital signal by an analog-to-digital converter by changing a number of times N of sampling of the analog output signal obtained in a region corresponding to one pixel according to the scan rate by sampling the analog output signal at a given sampling rate;

averaging the digital signal; and modifying a bit depth of one pixel of image data according to the scan rate by adding N digital signals obtained by N times of sampling of the analog output signal obtained in the region corresponding to one pixel and by dividing a result of the addition by the number of sampling times N, wherein the number of sampling times N is increased when the scan rate is reduced, and wherein the bit depth of the image data is increased when the scan rate is reduced.

\* \* \* \* \*